United States Patent [19]
Wu

[11] Patent Number: 6,107,126
[45] Date of Patent: Aug. 22, 2000

[54] METHOD TO FORM DIFFERENT THRESHOLD NMOSFETS FOR READ ONLY MEMORY DEVICES

[75] Inventor: Shye-Lin Wu, Hsinchu, Taiwan

[73] Assignee: Texas Instruments-Acer Incorporated, Hsinchu, Taiwan

[21] Appl. No.: 09/013,425

[22] Filed: Jan. 26, 1998

[51] Int. Cl.$^7$ ............................................. H01L 21/8246
[52] U.S. Cl. ........................... 438/217; 438/276; 438/526
[58] Field of Search ................................... 438/130, 200, 438/217, 275, 276, 277, 278, 279, 282, 289, 291, 526

[56] References Cited

U.S. PATENT DOCUMENTS

| | | | |
|---|---|---|---|
| 4,472,871 | 9/1984 | Green et al. | 438/276 |
| 5,081,052 | 1/1992 | Kobayashi et al. | 438/291 |
| 5,514,610 | 5/1996 | Wann et al. | 438/278 |
| 5,635,415 | 6/1997 | Hong | 438/261 |
| 5,830,795 | 11/1998 | Mehta et al. | 438/217 |

*Primary Examiner*—Chandra Chaudhari
*Attorney, Agent, or Firm*—Harness, Dickey & Pierce, P.L.C.

[57] ABSTRACT

A method for fabricating a Read Only Memory, (ROM), cell on a semiconductor substrate with device region and programmable cell region. The method includes the followed step. A plurality of field oxide regions is formed on the semiconductor substrate. A P-well and an N-well are formed in the device region of the semiconductor substrate, a P-well is formed in the programmable cell region of the substrate. A photoresist is formed over the N-well in the device region. Next, a phosphorus ion implantation is performed into the P-well in the device region for anti-punchthrough and into the N-well in the programmable region to form buried channel by using the photoresist layer as implant mask. After removing the photoresisit, a CMOS transistor is formed on the device region, and a NMOS transistor is formed on the programmable cell region.

17 Claims, 4 Drawing Sheets

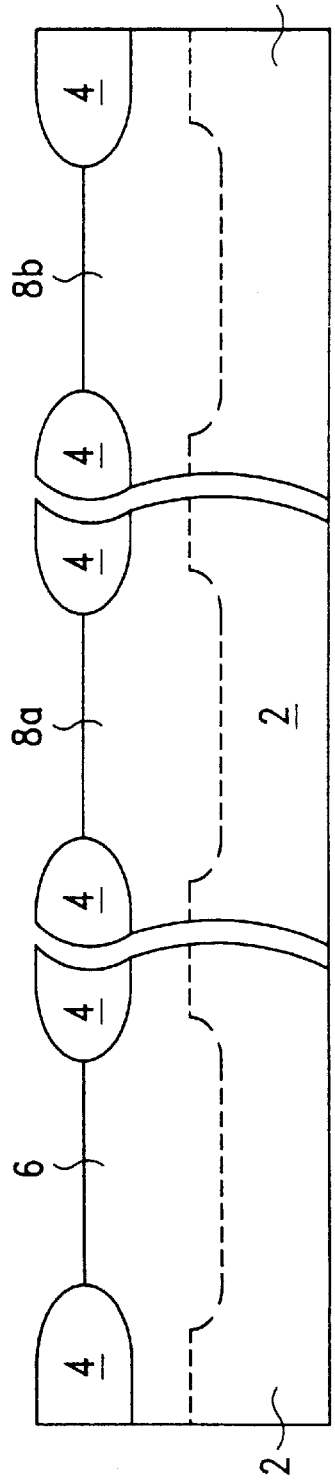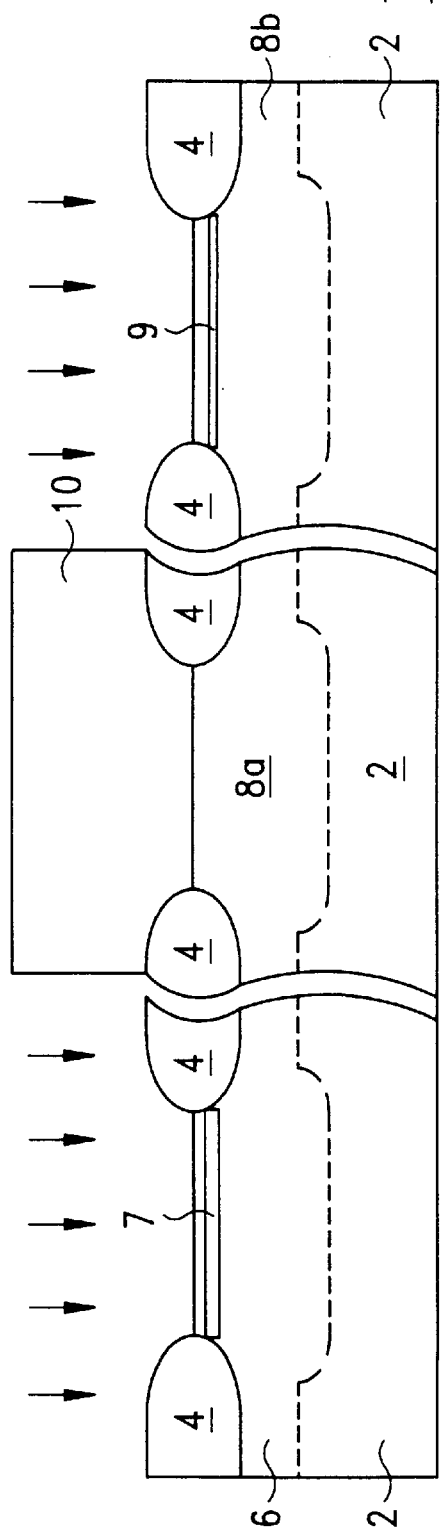

METHOD TO FORM DIFFERENT THRESHOLD NMOSFETS FOR READ ONLY MEMORY DEVICES

FIELD OF THE INVENTION

The present invention relates to a method of fabricating transistor devices, and more specifically, to fabricate a different threshold voltage NMOSFETs for read only memory devices.

BACKGROUND OF THE INVENTION

Read only memory (ROM) structures have been successfully employed as nonvolatile semiconductor memory devices. Most ROM designs and process usually can be described by three elements. First, buried bit lines are placed in a silicon substrate. The bit lines usually are heavily doped regions, opposite in conductive type with the substrate. Next word lines, usually polysilicon, are placed on gate oxide layers, perpendicular to buried bit lines. Finally, a specific channel region, arising from the intersection of the bit and word lines, is selectively programmed to electrically respond differently then intersections that have not received the programmed treatment. The programmable cell, as it electrically respond differently then intersections that have not received the programmed treatment. The programmable cell, as it is normally referred to, can be created either prior to, or after the fabrication of the polysilicon word line. The programmable cell can be achieved via many techniques. Most ROM designs and process are (1) buried line structure as seen in the reference "G. Hong, U.S. Pat. No. : 5,635,415 (1997)" and (2) ion implantation resulting in a different threshold voltage as in the reference "Y. J. Wann, et al., U.S. Pat. No. : 5,514,610 (1996)", etc. For the second case, an additional mask is necessary to achieve different threshold voltage.

SUMMARY OF THE INVENTION

This invention proposes a simple method to fabricate different threshold voltage NMOS for read only memory (ROM) devices without additional mask. Firstly, the well formation was done. Then, the phosphorus ion implantation was performed into N-well (PMOSFET) for anti-punchthrough stopping and into P-well (cell region only) to form a low threshold voltage NMOSFET for ROM memory. The CMOS transistors were fabricated by a standard process and then the metal contact and interconnection were completed. The benefits of this invention are (1) the different threshold voltage NMOSFETs could be easily made without additional mask, and (2) the proposed recipe is easy for manufacturing.

BRIEF DESCRIPTION OF THE DRAWINGS

The forgoing aspects and many of the attendant advantages of this invention will become more readily appreciated as the same becomes better understood by reference to the following detailed description, when taken in conjunction with the accompanying drawings, wherein:

FIG. 1 is a cross-sectional view of illustrating the step of forming N-well for PMOSFET and P-well for NMOSFET according to the present invention;

FIG. 2 is a cross-sectional view of illustrating the step of performing phosphorus ion implant for anti-punch through for PMOSFET and buried channel for NMOS cell according to the preset invention;

DETAILED DESCRIPTION OF THE PREFERRED EMBODIMENT

Figure 3:
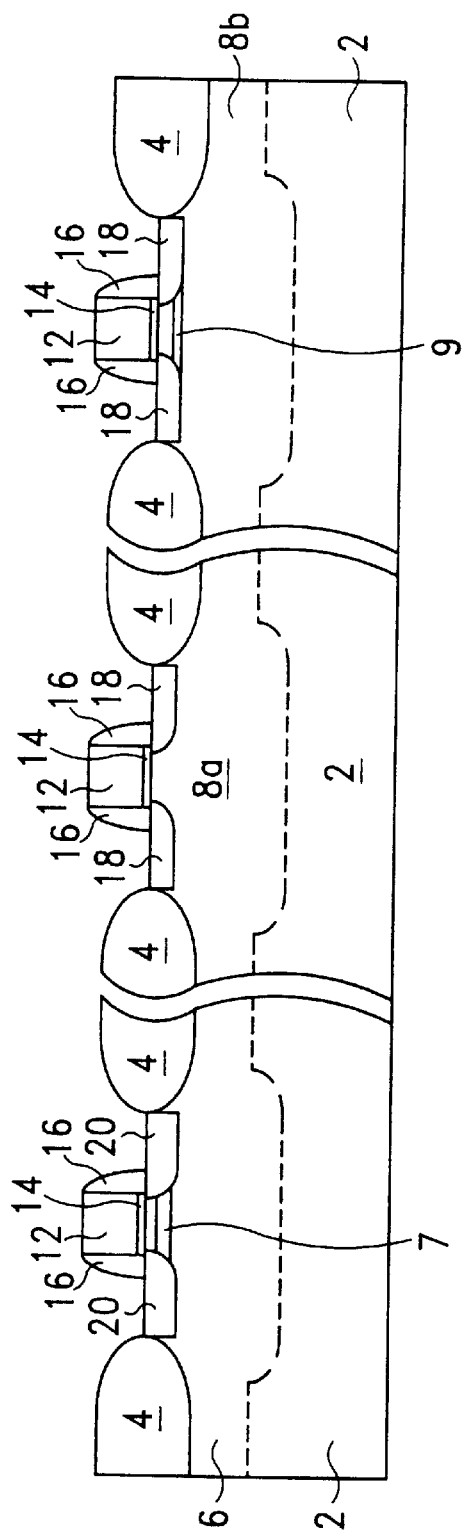
FIG. 3 is a cross-sectional view of illustrating the formation of CMOS transistor by standard process in the present invention.

The present invention relates to a method of fabricating transistor devices, and more specifically, to fabricate a different threshold voltage NMOSFETs for read only memory devices. The detailed process will be described as follows.

Please reference to FIG. 1. In a preferred embodiment, a single crystal silicon substrate 2 with a <100> crystallographic orientation is provided. A plurality of thick field oxide (FOX) regions 4 is formed to provide isolation between devices on the substrate 2. For example, the FOX regions 4 can be formed via lithography and etching steps to etch a silicon nitride-silicon dioxide composition later. After the photoresist is removed and wet cleaned, thermal oxidation in an oxygen-steam environment is used to grow the FOX region 4 to a thickness about 3000–8000 angstroms. The FOX region 4 can be replaced by a plurality of shallow trench isolations, as well known in the art.

After the isolation is done, we form N-well 6 for PMOSFET device and P-well 8a, 8b for NMOSFET device and NMOS cell in the substrate 2. The N-well and P-well are formed using conventional ion implantation. In a preferred embodiment, the N-well is formed by implanting phosphorus with dosage about $5\times10^{11}$ to $1\times10^{14}$ ions/cm$^2$, implant energy about 80 to 3000 KeV. The P-well is formed by implanting Boron with dosage about $5\times10^{11}$ to $1\times10^{14}$ ions/cm$^2$, implant energy about 50 to 3000 KeV. A region of the substrate 2 for fabricating device (peripheral circuit) is called device region and a region for fabricating ROM cell is called programmable cell region.

Next, referring to FIG. 2, a phosphorus ion implantation is performed into the N-well 6 for anti-punchthrough stopping and into P-well (cell region only) 8b to form a low threshold voltage NMOSFET for ROM memory. This ion implantation have formed an anti-punchthrough stopping layer 7 in N-well 6, and a buried channel region 9 in the P-well 8b. The P-well 8a for NMOSFET device is covered by a first photoresist 10 as a mask during the ion implantation. In a preferred embodiment, the dosage of the phosphorus ion implantation is about $10^{12}$ to $10^{14}$ ions/cm$^2$, the implant energy is about 50 to 200 KeV.

Referring to FIG. 3, the CMOS transistor is fabricated by standard process. The process will be described briefly as the following statement. First, we fabricate gate on the P-well 8a and N-well 6 of the device region, and on the P-well 8b of the cell region (programmable cell region), respectively. The gate includes the following member, there are gate oxide 12, polysilicon gate 14, and side wall spacers 16. After this, a second photoresist is formed over the N-well 6 and cover the gate on the N-well 6. Then, an n conductive type(As, P, . . . ) ion implantation is performed with dosage about $2\times10^{14}$ to $5\times10^{16}$ ions/cm$^2$, implant energy 0.5 to 80 KeV to form the source and drain regions 18 in the P-well 8a of device region and P-well 8b of the cell region, respectively, by using the second photoresist layer as implant mask. So we have fabricated a NMOSFET in device region and a NMOSFET with buried channel 9 in programmable cell region. The second photoresist is removed, then a third photoresist is formed over NMOSFET in device region and a NMOSFET with buried channel 9 in cell region (programmable cell region). A p conductive(B, $BF_2$, . . . ) ion implantation is performed with dosage about $2 \times 10^{14}$ to $5 \times 10^{16}$ ions/cm$^2$, implant energy 0.5 to 80 KeV to form the source and drain regions 20 in the P-well 8a of device region. The third photoresist is removed, followed by careful wet cleans.

Figure 4:
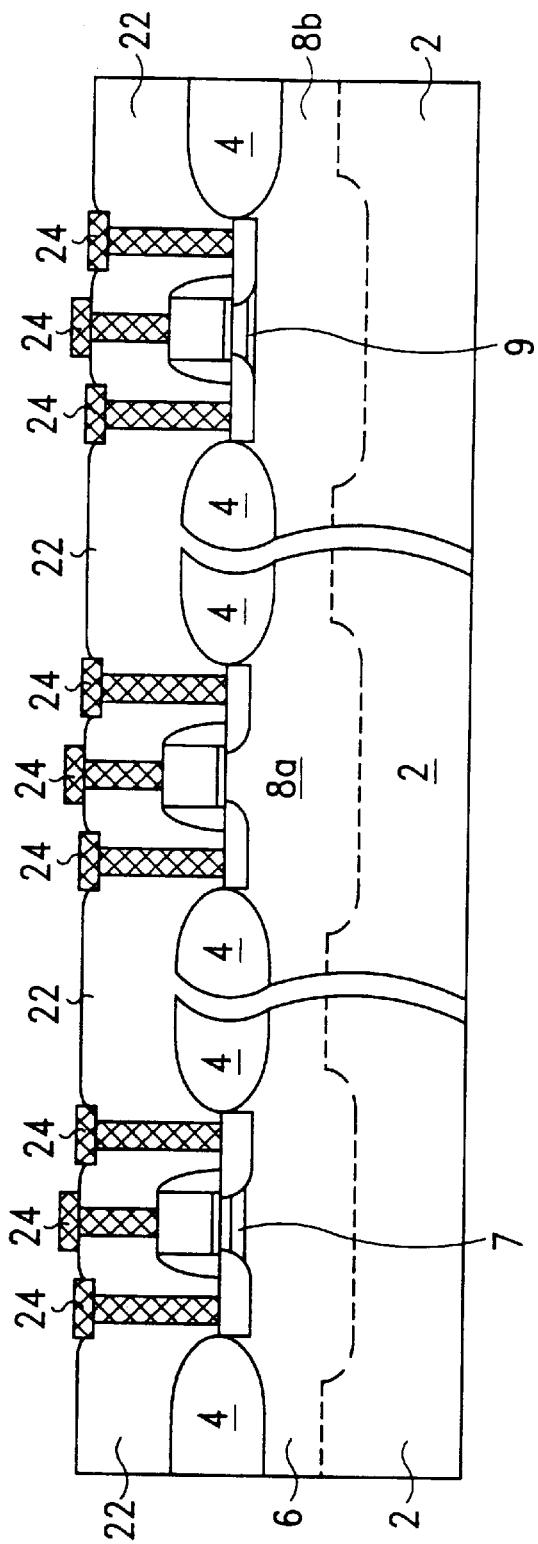
FIG. 4 is a cross-sectional view of illustrating the formation of metal contact and interconnection in the present invention.

Referring to FIG. 4, a thick oxide layer 22 is formed over all regions by chemical vapor deposition. In this preferred embodiment, the thick oxide layer can be a silicon dioxide film, a TEOS film, a BPSG film, or a PSG film. A standard contact hole, via hole process and metal plug process is used to form the metal contacts 24 of source, drain, and interconnect of gate in each transistor.

Figure 5A:
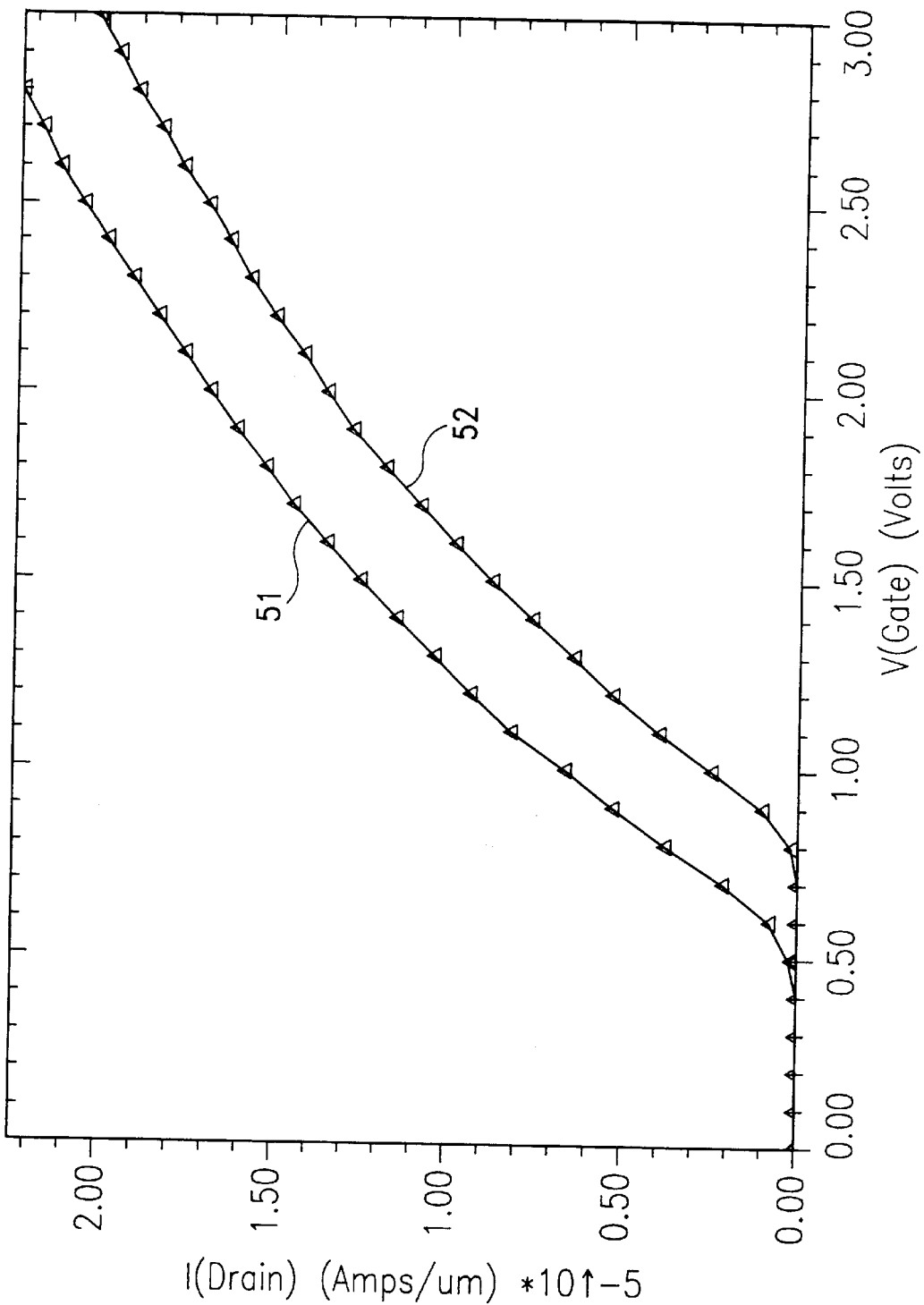
FIG. 5(a) is the plots of 0.5 μm LDD NMOSFET $I_d$-$V_g$ characteristics with phosphorus anti-punchthrough implant.
Figure 5B:
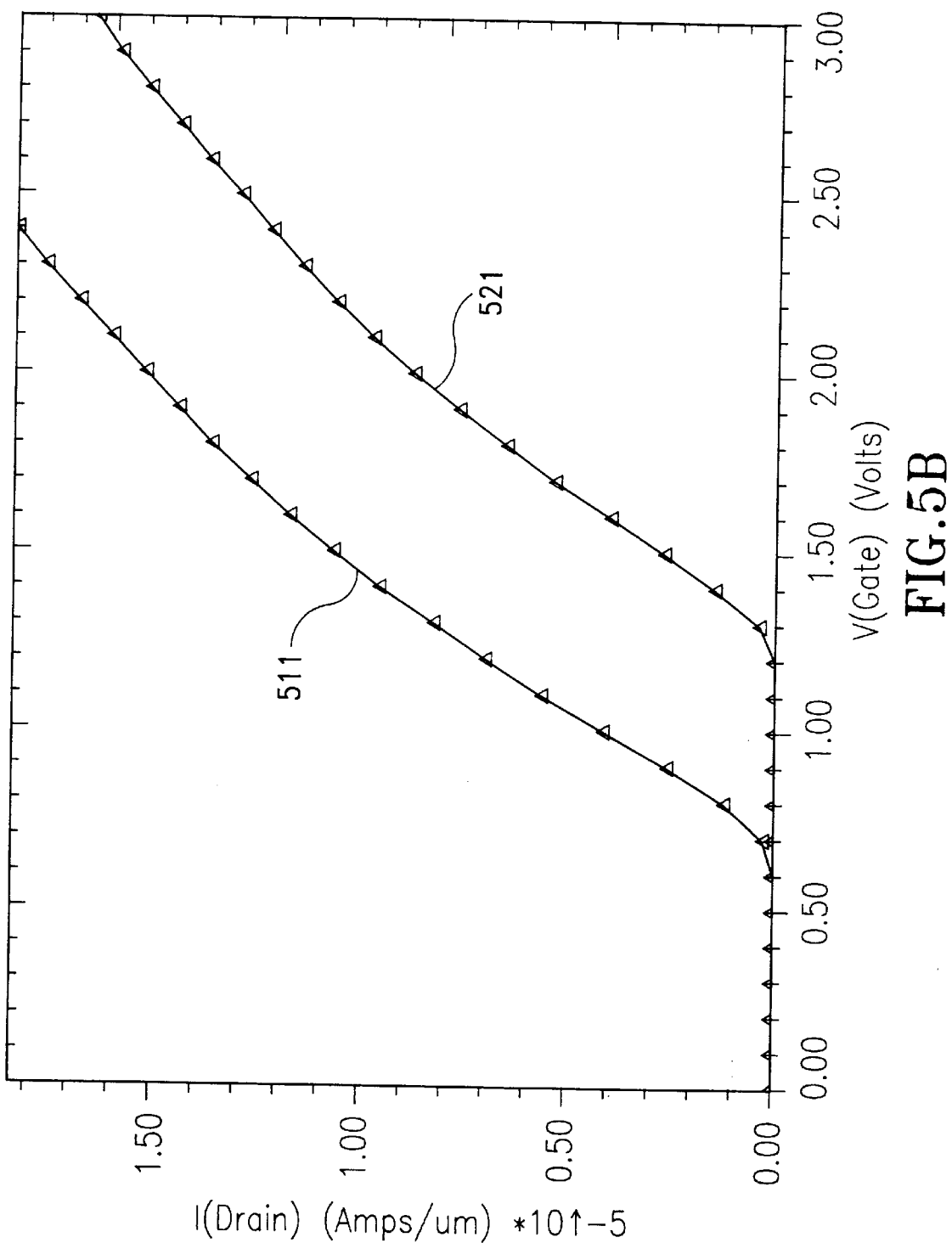
FIG. 5(b) is the plots of 0.5 μm LDD NMOSFET $I_d$-$V_g$ characteristics without phosphorus anti-punchthrough implant.

Referring to FIG. 5a, in this figure, the threshold voltage for ROM cell is shown. Curve 51 is the I-V curve of the NMOSFET ROM cell with substrate bias $V_{sub}$=0Volt, and threshold voltage $V_{th}$=0.56 volt. Curve 52 is the I-V curve of the NMOSFET ROM cell with substrate bias $V_{sub}$=-2Volt and threshold voltage $V_{th}$=0.84 volt. The threshold voltage of the NMOSFET peripheral circuit is shown in FIG. 5(b). Curve 511 is the I-V curve of the NMOSFET peripheral circuit with substrate bias $V_{sub}$=0Volt, and threshold voltage $V_{th}$=0.73 volt. Curve 521 is the I-V curve of the NMOSFET peripheral circuit with substrate bias $V_{sub}$=-2Volt and threshold voltage $V_{th}$=1.30 volt.

According to the spirits of the present invention, the peripheral circuit, i.e. the transistors in the device region are not only limited to use CMOS transistor, a NMOSFET transistor or PMOSFET transistor also can be used to act as peripheral circuit element.

To review our present invention, the different threshold voltage NMOSFETS could be easily made without the additional mask (i.e. without the screen oxide) that mentioned in the reference of "Y. J. Wann, et al., U.S. Pat. No. :5,514,610 (1996)".

The benefits of this invention are (1) the different threshold voltage NMOSFETs could be easily made without additional mask that compared to process of the reference "Y. J. Wann, et al., U.S. Pat. No. :5,514,610 (1996)", and (2) the proposed recipe is easy for manufacturing.

As is understood by a person skilled in the art, the foregoing preferred embodiment of the present invention that are illustrated are of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention. For example, this method described above can also be used for the fabrication for any metal oxide semiconductor field oxide effect transistor, including PMOS, NMOS, BiCMOS.

The embodiments of the invention in which an exclusive property or privilege is claimed are defined as follows:

1. A method for fabricating a Read Only Memory, (ROM), cell on a semiconductor substrate with device region and programmable cell region, said method comprising the step of:

forming a plurality of field oxide regions on said semiconductor substrate;

forming a first conductive well and a second conductive well in said device region of said semiconductor substrate, a second conductive well in said programmable cell region of said substrate;

forming a first photoresist over said second conductive well in said device region;

performing a first conductivity type ion implantation into said first conductive well in said device region for anti-punchthrough and into said second conductive type well in said programmable cell region to form buried channel by using said first photoresist layer as implant mask;

removing said photoresisit; and forming a CMOS transistor on said device region, a NMOS transistor on said programmable cell region.

2. The method of claim 1, wherein said first conductive well comprises an N well.

3. The method of claim 2, wherein said N well is formed by n conductive type ion implantation.

4. The method of claim 3, wherein a energy of said n conductive type ion implantation is about 80 to 3000 KeV.

5. The method of claim 1, wherein said second conductive well comprises a P well.

6. The method of claim 5, wherein said P well is formed by p conductive type ion implantation.

7. The method of claim 6, wherein a energy of said p conductive type ion implantation is about 50 to 3000 KeV.

8. The method of claim 1, wherein said first conductivity ion implantation comprises phosphorus.

9. The method of claim 8, wherein a dosage of said phosphorus ion implantation is about $10^{12}$ to $10^{14}$ ions/cm$^2$.

10. The method of claim 8, wherein an energy of said phosphorus ion implantation is about 50 to 200 KeV.

11. A method for fabricating a Read Only Memory, (ROM), cell on a semiconductor substrate with device region and programmable cell region, said method comprising the step of:

forming a plurality of field oxide regions on said semiconductor substrate;

forming an N well and a P well in said device region of said semiconductor substrate, a P well in said programmable cell region of said substrate;

forming a photoresist over said P well in said device region;

performing a phosphorus ion implantation into said N well in said device region for anti-punchthrough and into said P well in said programmable region to form buried channel by using said photoresist layer as implant mask;

removing said photoresisit; and forming a CMOS transistor on said device region, a NMOS transistor on said programmable region.

12. The method of claim 11, wherein a dosage of said phosphorus ion implantation is about $10^{12}$ to $10^{14}$ ions/cm$^2$.

13. The method of claim 11, wherein an energy of said phosphorus ion implantation is about 50 to 200 KeV.

14. The method of claim 11, wherein said N well is formed by n conductive type ion implantation.

15. The method of claim 14, wherein a energy of said n conductive type ion implantation is about 80 to 3000 KeV.

16. The method of claim 11, wherein said P well is formed by p conductive type ion implantation.

17. The method of claim 16, wherein a energy of said p conductive type ion implantation is about 50 to 3000 KeV.

* * * * *